(12) United States Patent
Tokumoto et al.

(10) Patent No.: US 8,919,277 B2
(45) Date of Patent: Dec. 30, 2014

(54) COATING APPLICATOR, COATING APPLICATION METHOD AND ELECTRONIC DEVICE

(75) Inventors: Takao Tokumoto, Osaka (JP); Sadao Natsu, Osaka (JP); Mitsuhiro Hida, Osaka (JP); Souichirou Iwasaki, Osaka (JP); Tsuyoshi Sato, Yokohama (JP); Kenichi Ooshiro, Yokohama (JP)

(73) Assignees: Chugai Ro Co., Ltd, Osaka-Shi (JP); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/268,230

(22) Filed: Oct. 7, 2011

(65) Prior Publication Data
US 2012/0025145 A1 Feb. 2, 2012

Related U.S. Application Data

(63) Continuation of application No. PCT/JP2010/059059, filed on May 28, 2010.

(30) Foreign Application Priority Data

Jun. 8, 2009 (JP) .................................. 2009-137231

(51) Int. Cl.
*B05B 3/00* (2006.01)
*B05B 13/02* (2006.01)
*B05C 11/02* (2006.01)
*H01L 21/67* (2006.01)
*B05C 13/02* (2006.01)
*B05D 1/00* (2006.01)
*B05D 1/26* (2006.01)

(52) U.S. Cl.
CPC .............. *H01L 21/6715* (2013.01); *B05C 13/02* (2013.01); *B05D 1/002* (2013.01); *B05D 1/26* (2013.01)
USPC ............. 118/321; 118/323; 118/52; 118/612; 239/601

(58) Field of Classification Search
USPC ............. 118/319–320, 52, 612, 56, 300, 321, 118/323; 427/240; 396/604, 611, 627; 134/153, 198, 902; 239/601, 602
See application file for complete search history.

(56) References Cited

U.S. PATENT DOCUMENTS 6,261,367 B1 * 7/2001 Donges .......................... 118/305
6,869,234 B2 * 3/2005 Sanada et al. ................. 396/604

FOREIGN PATENT DOCUMENTS

JP 2001-310155 A 11/2001
JP 2003-117477 A 4/2003

(Continued)

OTHER PUBLICATIONS

Notification of Transmittal of Copies of Translation of the International Preliminary Report on Patentability (Form PCT/IB/338) of International Application No. PCT/JP2010/059059 mailed Jan. 26, 2012 with Forms PCT/IB/373, PCT/ISA/237 and PCT/IB/326.

(Continued)

Primary Examiner — Yewebdar Tadesse
(74) Attorney, Agent, or Firm — Westerman, Hattori, Daniels & Adrian, LLP

(57) ABSTRACT

A cylindrical coating nozzle having a flattened end is placed above a coating object being rotated. A coating solution is applied to a surface of the coating object by discharging the coating solution form a nozzle orifice at an end of the coating nozzle while moving the coating nozzle relative to the coating object in a direction intersecting a rotational direction of the coating object. The coating nozzle is formed with an angled notch at a part of the end thereof. A rotation control unit controls the rotation of the coating nozzle in a manner that the notch of the coating nozzle is positioned upstream from a position to feed the coating solution to the coating object being rotated.

7 Claims, 10 Drawing Sheets

(56) References Cited

FOREIGN PATENT DOCUMENTS

| | | |
|---|---|---|
| JP | 2003-211045 A | 7/2003 |
| JP | 2005-111295 A | 4/2005 |
| JP | 2006-130429 A | 5/2006 |
| JP | 3776745 B2 | 5/2006 |
| JP | 2008-194635 A | 8/2008 |

OTHER PUBLICATIONS

Second and Supplementary Notice Informing the Applicant of the Communication of the International Application (To Designated Offices Which Apply The 30 Month Time Limit Under Article 22 (1)) of International Application No. PCT/JP2010/059059 mailed Oct. 13, 2011 with form PCT/IB/308.

International Search Report of PCT/JP2010/059059, mailing date Aug. 24, 2010.

Background Art Information for Foreign Patent Document Nos. JP3776745, JP2001-310155, JP2003-117477, JP2006-130429 submitted with IDS filed Oct. 7, 2011.

Japanese Office Action dated Feb. 12, 2014, issued in correspondsing Japanese application No. 2011-518422, w/ English translation (8 pages).

* cited by examiner (A)

(B)

COATING APPLICATOR, COATING APPLICATION METHOD AND ELECTRONIC DEVICE

RELATED APPLICATION

This application is based on International Application PCT/JP2010/059059 which claims priority on the basis of Japanese Patent Application No. 2009-137231.

BACKGROUND OF THE INVENTION

1. Field of the Invention

The present invention relates to a coating applicator and a coating application method as well as to an electronic device manufactured by the above coating applicator or according to the above coating application method. The coating applicator operates as follows. While rotating a coating object retained on a turntable, a coating nozzle is placed above the coating object. As moved relative to the coating object in a direction intersecting a rotational direction of the coating object, the coating nozzle discharges a coating solution from a nozzle end orifice thereof, thereby applying the coating solution to the surface of the coating object. Particularly, in regard to applying the coating solution to the surface of the coating object being rotated, as described above, the coating nozzle is characterized as being capable of evenly applying the coating solution to form a coat of a uniform thickness on the surface of the coating object.

2. Description of the Related Arts

In the manufacture of the electronic devices such as semiconductor devices, it has been a general practice to apply the coating solution to the surface of the coating object such as a semiconductor wafer by means of the coating applicator.

As disclosed in patent documents 1 to 3, the following apparatus is used as one of such coating applicators. In this apparatus, the coating object retained in horizontal position is rotated while a cylindrical coating nozzle is placed above this coating object. The coating nozzle discharges the coating solution from the end thereof as moved over this rotating object in a radial direction thereof whereby the coating solution is applied to the surface of the coating object.

In regard to applying the coating solution to the surface of the coating object as described above, the above coating nozzle may be tapered at the end as disclosed in Japanese Patent Application No. 3776745 and Japanese Unexamined Patent Publication No. 2001-310155. Alternatively, the coating nozzle may be shaped like a cylinder having a flattened end as disclosed in Japanese Unexamined Patent Publication No. 2003-117477.

As shown in FIG. 1, the following problem is encountered in a case where a coating nozzle 1 having a tapered end is used to apply a coating solution 2 to a surface of a coating object 3 being rotated. This coating nozzle 1 has such a small flattened area at the end thereof that the coating nozzle 1 feeding the coating solution 2 through a nozzle end orifice 1a thereof fails to form a fully flat coat on the surface of the coating object 3 being rotated. The coating solution 2 so applied to the surface of the coating object 3 forms a coat varied in thickness, width and the like.

As shown in FIG. 2, on the other hand, the following advantage is obtained in a case where a coating nozzle 1 shaped like a cylinder having a flattened end is used to apply the coating solution 2 to the surface of the coating object 3 being rotated. This coating nozzle 1 has such a large flattened area at the end thereof that the coating nozzle 1 feeding the coating solution 2 through the nozzle end orifice 1a thereof forms a flat coat on the surface of the coating object 3 being rotated.

However, the following problem occurs in the case where the coating nozzle 1 shaped like the cylinder having the flattened end is used. As shown in FIG. 2, a part of the coating solution 2 fed to the surface of the coating object 3 through the nozzle end orifice 1a of the coating nozzle 1 is shifted to an upstream portion of the end of the coating nozzle 1, or upstream from a position to feed the coating solution 2 to the coating object 3. Because of the effect of surface tension and the like, the shifted coating solution accumulates on the end of the coating nozzle 1, forming a bump upstream from the position to feed the coating solution 2 to the coating object 3.

The coating solution 2 accumulated into bump runs down onto the coating object 3, resulting in fragmentary bumps 2a of coating solution 2 distributed on the coating object 3, as shown in FIG. 2 and FIG. 3. As shown in FIG. 4, the coating object 3, which is coated with the coating solution 2, suffers from the distributed fragmentary bumps 2a of coating solution 2. That is, it is difficult for the coating nozzle 1 to evenly apply the coating solution 2 to the surface of the coating object 3.

SUMMARY OF THE INVENTION

It is an object of the invention to solve the above-described problem in the coating application process wherein the coating nozzle is placed above the coating object rotated as retained in horizontal position, and discharges the coating solution from the nozzle end orifice thereof as moved in the radial direction of the coating object being rotated, thereby applying the coating solution to the surface of the coating object.

Namely, the invention seeks to ensure that the coating nozzle can evenly apply the coating solution to form the coat of a uniform thickness on the surface of the coating object in the above-described operation of applying the coating solution to the surface of the coating object being rotated.

A coating applicator according to an aspect of the invention comprises: a turntable retaining a coating object thereon; a rotating device for rotating the turntable; a coating nozzle for applying a coating solution to a surface of the coating object by discharging the coating solution from a nozzle orifice at an end thereof to the coating object retained on the turntable; a transfer device for moving the coating nozzle relative to the coating object in a direction intersecting a rotational direction of the coating object; and a rotation control unit for controlling the rotation of the coating nozzle, wherein the coating nozzle including the nozzle orifice is formed with an angled notch at a part of the flattened end thereof and the rotation control unit controls the rotation of the coating nozzle in a manner to position the notch of the coating nozzle upstream from a position to feed the coating solution to the coating object being rotated.

In the coating applicator according to another aspect of the invention, it is preferred that the rotation control unit controls the rotation of the coating nozzle in a manner that the coating nozzle is rotated to position the notch thereof in the same direction as that of a resultant vector which is formed from a feed rate vector of the coating nozzle moved relative to the coating object in the direction intersecting the rotational direction of the coating object and a velocity vector of the coating nozzle moved relative to the coating object in a normal direction from the position for the coating nozzle to feed the coating solution.

In the coating applicator according to another aspect of the invention, the notch has an inclination angle α relative to the flattened end of the coating nozzle preferably in the range of 10° to 70° or more preferably in the range of 20° to 60°.

In the coating applicator according to another aspect of the invention, it is preferred that the coating nozzle is formed with a chamfer that is smaller than the notch and extends along an outside circumference of the coating nozzle end formed with the notch. The chamfer is provided for more assuredly obviating the problem that the surface tension and the like cause some coating solution, fed from the nozzle end orifice of the coating nozzle to the surface of the coating object, to accumulate into bump on the upstream portion of the coating nozzle end or upstream from the position to feed the coating solution to the coating object.

In the above coating applicator, the coating nozzle may be moved as follows relative to the coating object in the direction intersecting the rotational direction of the coating object. The relative movement of the coating nozzle may be accomplished by moving the coating nozzle radially outwardly from the center of rotation of the rotated coating object to an outside circumference thereof, or by moving the coating nozzle radially inwardly from the outside circumference of the coating object being rotated to the center of rotation thereof. From the viewpoint of proper control of the coat thickness at the center of rotation of the coating object, the relative movement of the coating nozzle may preferably be accomplished by moving the coating nozzle radially outwardly from the center of rotation of the coating object being rotated.

According to an aspect of the invention, a coating application method comprises the steps of: placing a cylindrical coating nozzle above a coating object rotated as retained on a turntable, the coating nozzle formed with an angled notch at a part of a flattened end thereof; and applying a coating solution to a surface of the coating object by discharging the coating solution from a nozzle end orifice of the coating nozzle while moving the coating nozzle relative to the coating object in a direction intersecting a rotational direction of the coating object, wherein a rotation control unit for controlling the rotation of the coating nozzle rotates the coating nozzle in a manner to position the notch of the coating nozzle upstream from a position to feed the coating solution to the coating object being rotated.

An electronic device according to an aspect of the invention is manufactured by applying the coating solution to the coating object by the above coating applicator or according to the above coating application method.

According to the coating applicator or the coating application method of the invention, the coating solution can be evenly applied to the surface of the coating object.

These and other objects, advantages and features of the invention will become apparent from the following description thereof taken in conjunction with the accompanying drawings which illustrate a specific embodiment of the invention.

DESCRIPTION OF THE PREFERRED EMBODIMENT

Figure 1:
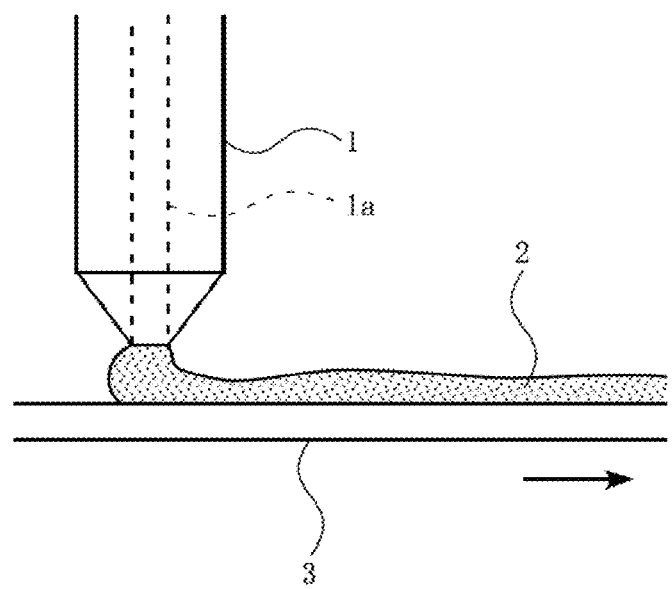
FIG. 1 is a schematic view illustrating a conventional coating applicator wherein a coating nozzle having a tapered end applies a coating solution to a surface of a rotated coating object by discharging the coating solution from a nozzle end orifice thereof.

According to a coating applicator and a coating application method of the invention, a coating object retained on a turntable is rotated as described above while a cylindrical coating nozzle having a flattened end is placed above this coating object. As moved relative to the coating object in a direction intersecting a rotational direction of the coating object, the coating nozzle discharges a coating solution from a nozzle end orifice, thereby applying the coating solution to a surface of the coating object. In this regard, the coating nozzle having the flattened end and operating to discharge the coating solution is formed with an angled notch at a part of the end thereof. A rotation control unit controllably rotates the coating nozzle in a manner to position the notch of the coating nozzle upstream from a position to feed the coating solution to the coating object being rotated. That is, the notch of the coating nozzle is positioned on a side yet to be coated with the coating solution. This ensures that the flattened end portion of the coating nozzle that excludes the notch applies the coating solution, which is discharged from the nozzle end orifice of the coating nozzle, as a flat coat on a surface of the coating object.

As described above, the coating nozzle is controllably rotated by the rotation control unit in the manner that the notch formed at the end of the coating nozzle is positioned upstream from the position to feed the coating solution to the coating object being rotated. Therefore, even if the coating nozzle feeding the coating solution to the surface of the coating object via the nozzle end orifice entails displacement of some coating solution to an upstream portion of the coating nozzle end or upstream from the position to feed the coating solution to the coating object, the above-described notch serves to return the displaced coating solution to a correct position to feed the coating solution to the surface of the coating object. This obviates the problem that the surface tension and the like cause some coating solution to accumulate on the upstream portion of the coating nozzle end or upstream from the position to feed the coating solution to the coating object, resulting in irregular feeding of the coating solution to the surface of the coating object.

Accordingly, the coating applicator and application method of the invention ensure that the coating nozzle can achieve the uniformity in coat thickness when applying the coating solution to the surface of the coating object being rotated, as described above.

According to the coating applicator and application method of the invention, it is preferred that the notch has an inclination angle α to the flattened end of the above coating nozzle in the range of 10° to 70° or more preferably of 20° to 60°. If the notch of the coating nozzle has the inclination angle in the above-described range, the coating nozzle can more assuredly prevent the coating solution from accumulating on the end thereof or upstream from the position to feed the coating solution to the coating object. Thus is obviated the distribution of fragmentary bumps of coating solution on the coat applied to the surface of the coating object. The coating nozzle is adapted for even application of the coating solution to form a coat of a uniform thickness on the surface of the coating object.

According to the coating applicator and application method of the invention, it is preferred that a chamfer, smaller than the notch, is formed along an outside circumference of the coating nozzle end that is formed with the notch. If such a chamfer is formed along the outside circumference of the coating nozzle end, some coating solution drawn to the notch by the surface tension and the like is returned by the chamber along the outside circumference of the coating nozzle end to the correct position to feed the coating solution to the surface of the coating object. The coating nozzle is adapted for more assured prevention of the accumulation of the coating solution on the notch, achieving the even application of the coating solution to the surface of the coating object.

Next, the coating applicator and application method and an electronic device according to an embodiment of the invention will be specifically described with reference to the accompanying drawings. It is to be noted that coating applicator and application method according to the invention is not limited to the following embodiments but changes or modifications may be made thereto as needed so long as such changes or modifications do not depart from the scope of the invention.

Figure 5:
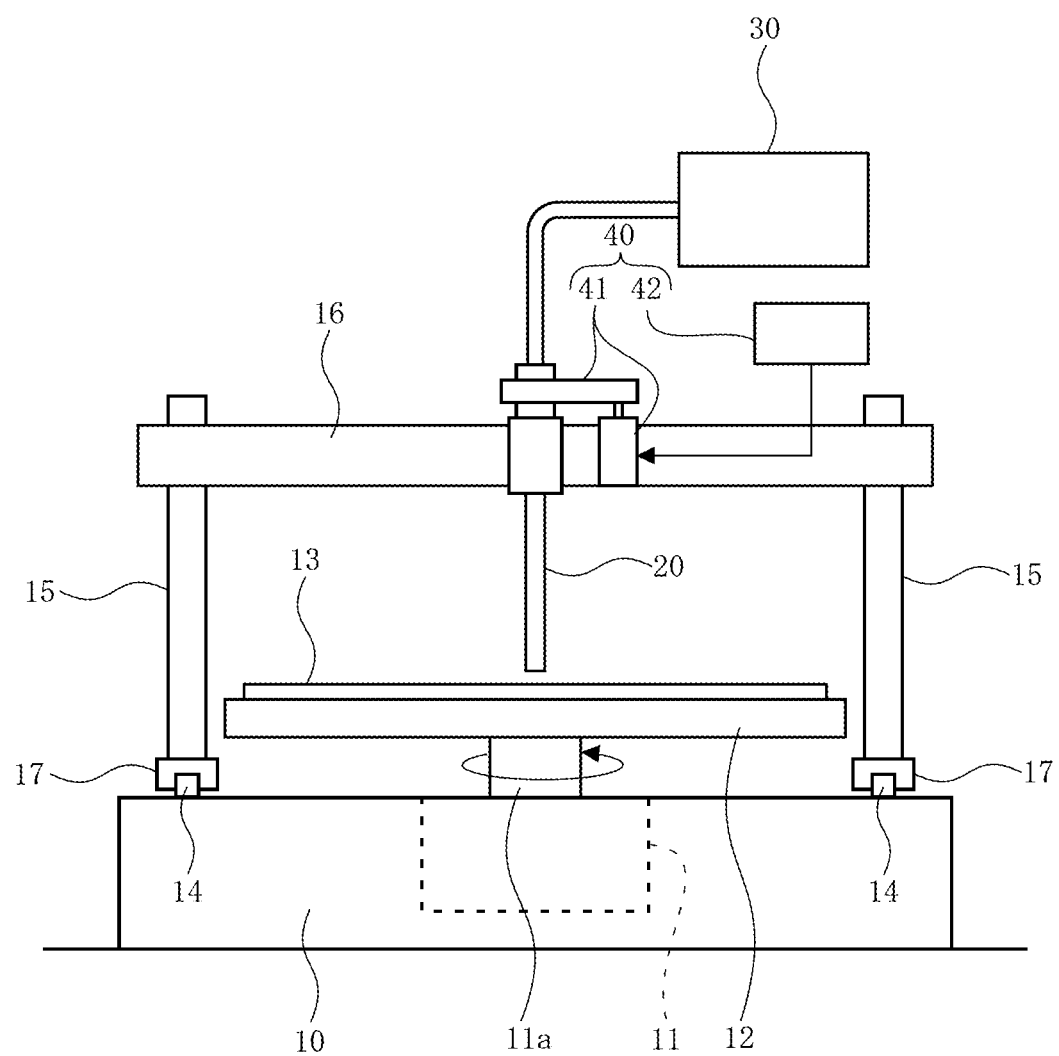
FIG. 5 is a schematic front view showing a coating applicator according to one embodiment of the invention for applying the coating solution to a surface of the coating object which is rotated as retained in horizontal position.
Figure 6:
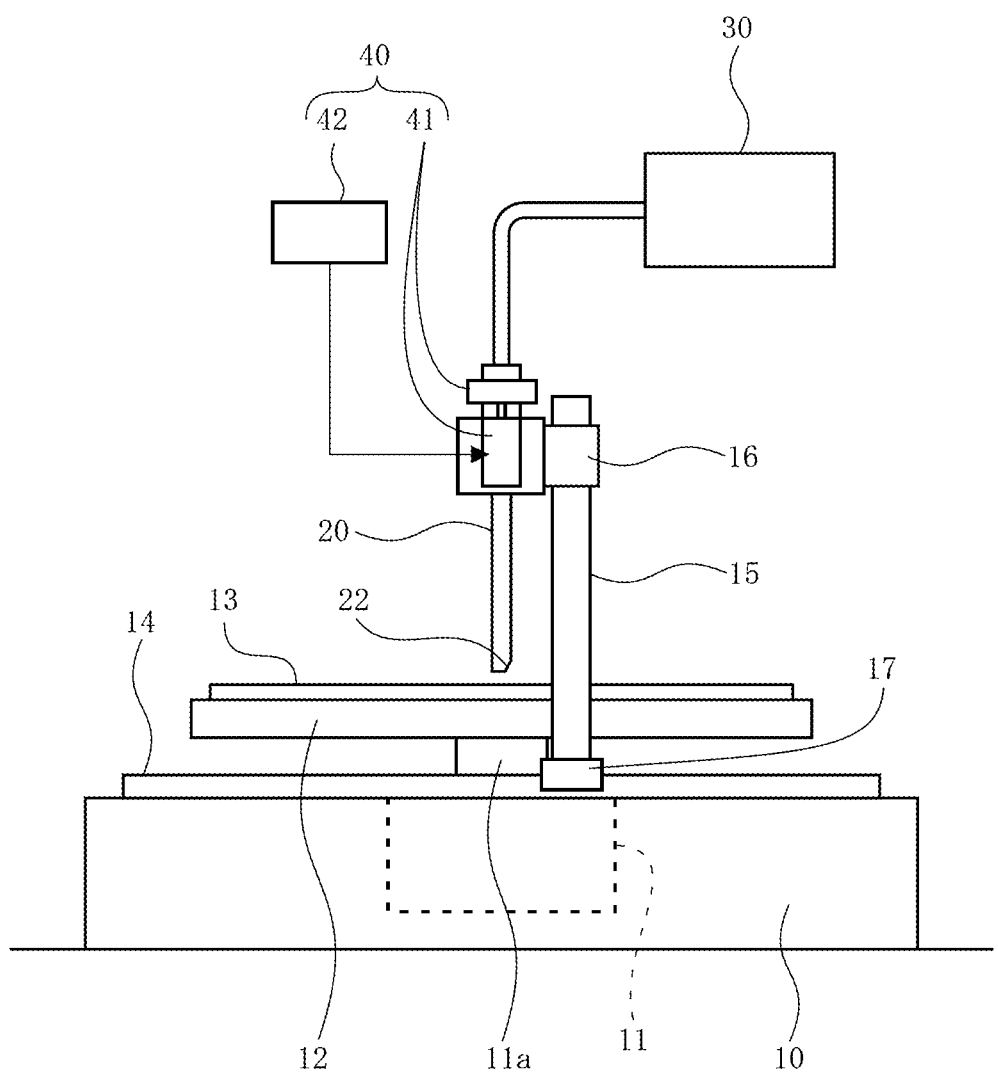
FIG. 6 is a schematic side view showing the coating applicator of the above embodiment.

As shown in FIG. 5 and FIG. 6, a coating applicator according to the embodiment has a structure wherein a turntable 12 is mounted to a distal end of a rotary shaft 11a of a rotating device 11, the rotary shaft extending upward from a base 10. A coating object 13 such as a wafer to be coated with a coating solution 31 is horizontally retained on the turntable 12 by suction. In this state, the turntable 12 mounted to the distal end of the rotary shaft 11a is rotated by the rotating device 11.

A pair of carriage rails 14 is laid on the base 10 on opposite sides with respect to the turntable 12. Pedestals 15 are moved on the pair of carriage rails 14 by means of a transfer device 17. A holder member 16 rotatably retains a coating nozzle 20 for discharging the coating solution 31. The holder member horizontally extends between the pedestals 15 in a manner to be free to move up or down. A coating solution feeder 30 is adapted to feed a proper amount of coating solution 31 in a regulative manner to the coating nozzle 20 retained by the holder member 16.

A rotation control unit 40 controls the rotation of the coating nozzle 20 rotatably retained by the holder member 16. The rotation control unit includes a nozzle rotating device 41 employing a motor and a pulley for rotating the coating nozzle 20 retained by the holder member 16, and a controller 42 for controlling the rotation of the coating nozzle 20 driven by the nozzle rotating device 41.

Figure 7:
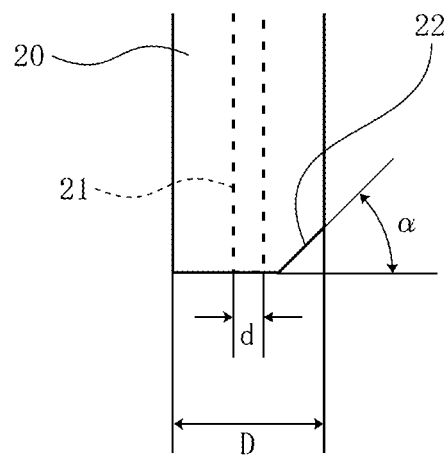
FIG. 7 is a fragmentary view illustrating a coating nozzle employed by the coating applicator of the above embodiment.

As shown in FIG. 7, the embodiment employs, as the above coating nozzle 20, a cylindrical coating nozzle 20 having a flattened end from which a nozzle end orifice 21 discharges the coating solution 31. An angled notch 22 is formed at a part of the flattened end. A detailed description will hereinlater be made on an inclination angle α of the angled notch 22 to the horizontal plane, the notch formed at a part of the end of the coating nozzle 20, and a ratio (d/D) of a diameter d of the nozzle orifice 21 to an outside diameter D of the coating nozzle 20. The end face of the coating nozzle 20 may have circular, rectangular or any other shape. The nozzle orifice 21 may also have circular, rectangular or any other shape.

Now, the following description is made on an operation according to the embodiment. While the coating object 13 comprising a substrate and retained on the turntable 12 by suction is driven into rotation by the rotating device 11, the coating nozzle 20 is placed above the coating object 13 and moved by the transfer device 17 in a radial direction of the coating object 13 being rotated. The coating nozzle 20 discharges the coating solution 31 from the nozzle end orifice 21 thereof, thereby applying the coating solution 31 to the surface of the coating object 13.

First, the transfer device 17 moves the pedestals 15 along the carriage rails 14 to position the coating nozzle 20 above the center of rotation of the coating object 13 retained on the turntable 12. The holder member 16 mounted to the pedestals 15 is lowered along the pedestals 15 so as to set the end of the coating nozzle 20 for discharging the coating solution 31 to position a required distance upward from the center of rotation of the coating object 13.

While the coating object 13 retained on the turntable 12 is driven into rotation by the rotating device 11, the transfer device 17 moves the pedestals 15 along the carriage rails 14 so as to move the end of the coating nozzle 20 radially outwardly from the center of rotation of the coating object 13 to an outside circumference thereof. The rotation of the coating nozzle 20 driven by the nozzle rotating device 41 is controlled by the controller 42 in a manner that the notch 22 formed at the end of the coating nozzle 20 is positioned upstream from a position to feed the coating solution 31 to the coating object 13 being rotated. As controlled in this manner, the coating nozzle 20 discharges the coating solution 31 from the nozzle end orifice 21 to the coating object 13, thereby applying the coating solution 31 to the surface of the coating object 13.

Figure 8:
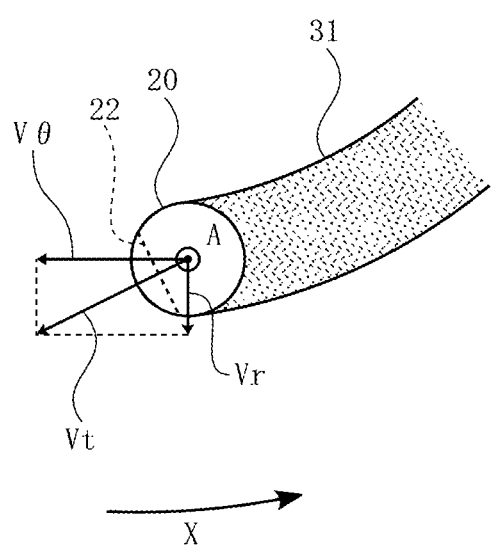
FIG. 8 is a schematic view illustrating the coating applicator of the above embodiment wherein the coating nozzle applies the coating solution to the rotated coating object while positioning a notch at an end thereof upstream from a position to feed the coating solution to the coating object.

According to the embodiment, the above controller 42 controls the rotation of the coating nozzle 20 driven by the nozzle rotating device 41 such that the notch 22 formed at the end of the coating nozzle 20 is positioned upstream from the position to feed the coating solution 31 to the coating object 13 being rotated. In this regard, a direction of a resultant vector Vt is determined which is formed from a feed rate vector Vr of the coating nozzle 20 moved in the radial direction and a velocity vector Vθ of the coating nozzle 20 moved relative to the coating object 13 in a normal direction from the position for the coating nozzle 20 to feed the coating solution 31. The rotation of the coating nozzle 20 driven by the nozzle rotating device 41 is controlled in a manner to position the notch 22 at the end of the coating nozzle 20 in the same direction as that of the resultant vector Vt. It is noted here that although the coating nozzle 20 itself does not move in the rotational direction of the coating object 13, the velocity vector Vθ of the coating nozzle 20 in relative movement is directed in a direction opposite to X direction of rotation arrow in FIG. 8 because the coating object 13 is rotated in the X direction indicated by the arrow.

In conjunction with the radial outward movement of the end of the coating nozzle 20 from the center of rotation of the coating object 13, the above controller 42 operates the nozzle rotating device 41 to rotate the coating nozzle 20 little by little. Thus, the notch 22 at the end of the coating nozzle 20 is positioned in the same direction as that of the resultant vector Vt when the end of the coating nozzle 20 is moved to an arbitrary point A shown in FIG. 8. The resultant vector Vt is formed from the feed rate vector Vr of the coating nozzle 20 moved in the radial direction and the velocity vector Vθ of the coating nozzle 20 moved relative to the coating object 13 in the normal direction from this point A. When the coating nozzle 20 in radially outward movement reaches an end position to terminate the coating application, the discharge of the coating solution 31 from the coating nozzle 20 is terminated.

Figure 9:
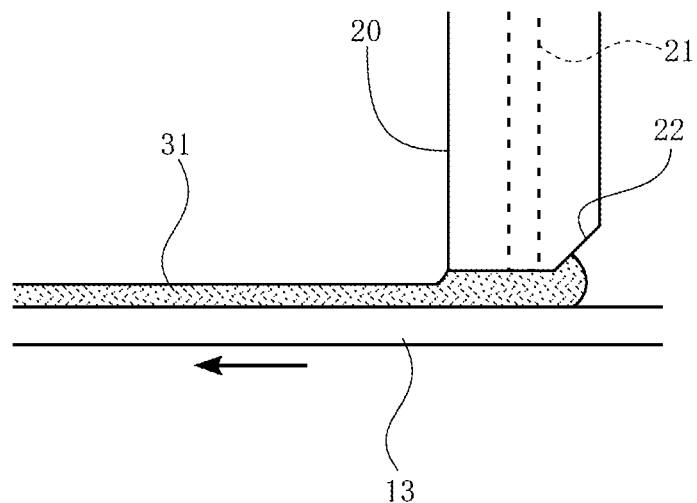
FIG. 9 is a fragmentary view illustrating the coating applicator of the above embodiment wherein the coating nozzle applies the coating solution to the surface of the rotated coating object by discharging the coating solution from a nozzle end orifice thereof while positioning the notch at the end thereof upstream from the position to feed the coating solution to the coating object.

In this manner, the coating nozzle 20 positions the notch 22 formed at the end thereof upstream from the position to feed the coating solution 31 to the coating object 13 being rotated and applies the coating solution 31 to the surface of the coating object 13 by discharging the coating solution 31 from the nozzle end orifice 21 thereof. As shown in FIG. 9, the flattened end of the coating nozzle 20 that excludes the notch 22 is adapted to apply the coating solution 31 as a flat coat on the surface of the coating object 13, the coating solution 31 discharged from the nozzle end orifice 21 of the coating nozzle 20.

Even if some coating solution 31 fed to the coating object 13 is shifted to the upstream portion of the coating nozzle end 20 or upstream from the position to feed the coating solution 31 to the coating object 13, the upstream notch 22 returns the shifted solution 31 to the correct position to feed the coating solution 31 to the surface of the coating object 13. Thus is obviated the problem that the surface tension and the like cause some coating solution 31 to accumulate into bump on the upstream portion of the end of the coating nozzle 20.

Thus is eliminated the problem that some coating solution 31 accumulated into bump on the upstream portion of the end of the coating nozzle 20 is irregularly fed from the end of the coating nozzle 20 to the surface of the coating object 13, so that the coating solution 31 applied to the surface of the coating object 13 forms a coat suffering from the local variations in thickness and width. The coating nozzle is adapted for even application of the coating solution 31 to the surface of the coating object 13, achieving the uniformity in coat thickness and width.

Figure 2:
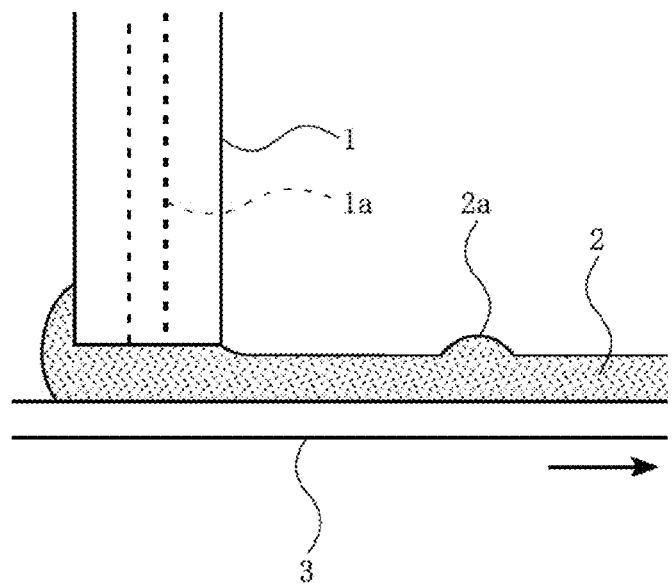
FIG. 2 is a schematic view illustrating a conventional coating applicator wherein a cylindrical coating nozzle having a flattened end applies the coating solution to the surface of the rotated coating object by discharging the coating solution from the nozzle end orifice thereof.
Figure 3:
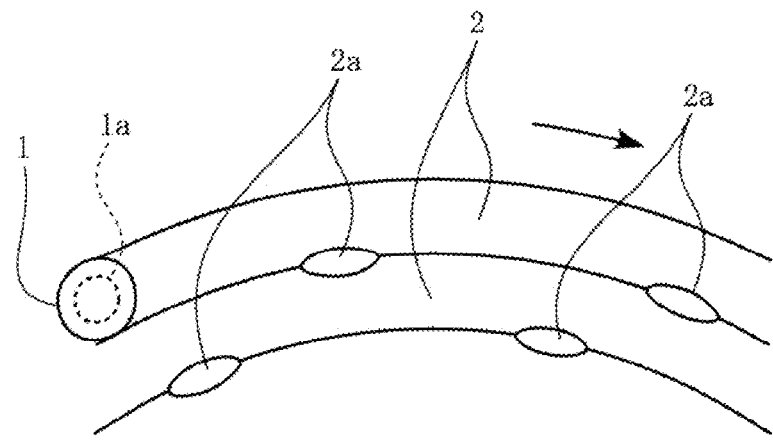
FIG. 3 is a fragmentary view illustrating fragmentary bumps of coating solution formed on the coating object in a case where the coating applicator of FIG. 2 applies the coating solution to the coating object.
Figure 4:
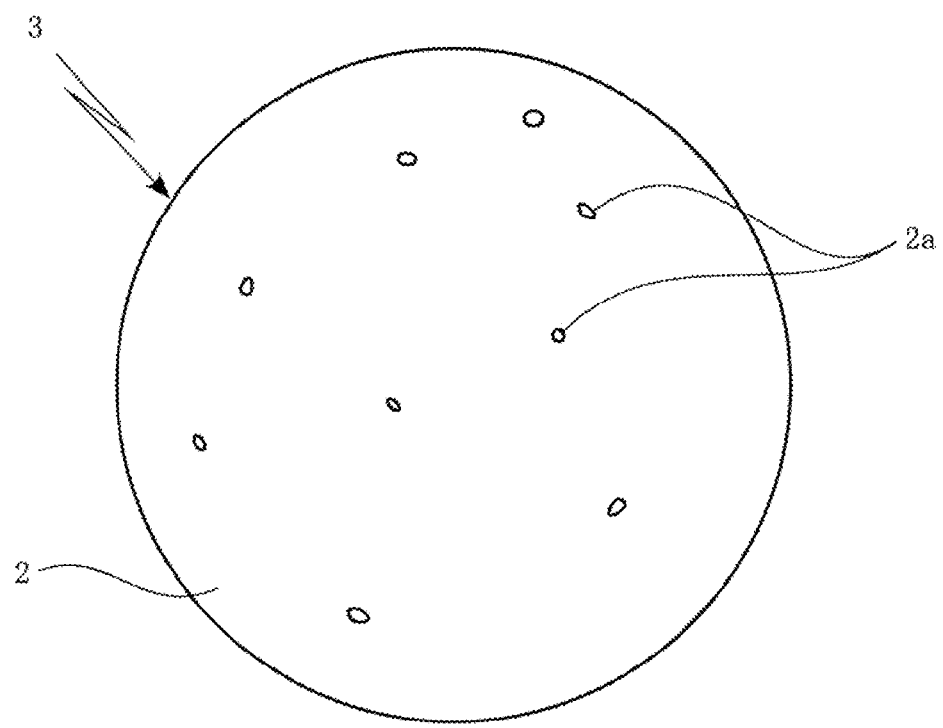
FIG. 4 is a schematic plan view showing the fragmentary bumps of coating solution distributed on the coating object in the case where the coating applicator of FIG. 2 applies the coating solution to the coating object.

As shown in FIG. 7, the following consideration may preferably be given in forming the angled notch 22 at a part of the end of the coating nozzle 20. If the inclination angle α of the notch 22 to the horizontal plane is too large, the notch 22 is decreased in function to return the coating solution 31 shifted to the upstream portion of the coating nozzle 20 to the correct position to feed the coating solution 31 to the coating object 13. On the other hand, if the inclination angle α of the notch 22 to the horizontal plane is too small, the coating nozzle suffers the same drawback as the conventional coating nozzle shown in FIG. 2. Having the too large or too small inclination angle α to the horizontal plane, the notch 22 is detrimentally affected by the surface tension and the like which cause some coating solution to accumulate into bump on the upstream portion of the coating nozzle.

Accordingly, the accumulated coating solution runs down onto the coating object, producing fragmentary bumps of coating solution on the coating object coated with the coating solution.

A test was conducted using coating nozzles 20 formed with angled notches 22 at respective parts of the ends thereof and having different notch inclination angles α to the horizontal plane. The coating solution 31 was applied to a coating object 31 having a diameter of 300 mm by using each of the coating nozzles. The coating objects 13 were examined for the formation of fragmentary bumps of coating solution 31.

The formation of the fragmentary bumps of the coating solution was evaluated on a 3-point scale. The results are shown in the following table 1 where ◎ indicates the absence of fragmentary bumps of coating solution, ○ indicates the existence of three or less fragmentary bumps, and X indicates the existence of four or more fragmentary bumps.

TABLE 1

| | Inclination Angle α of Notch | | | | | | | | | | | | |
|---|---|---|---|---|---|---|---|---|---|---|---|---|---|
| | 0° | 10° | 15° | 20° | 25° | 30° | 35° | 40° | 45° | 50° | 60° | 65° | 70° |
| Results | X | ○ | ○ | ◎ | ◎ | ◎ | ◎ | ◎ | ◎ | ◎ | ◎ | ○ | ○ |

The results indicate that the notch 22 preferably has the inclination angle α to the horizontal plane in the range of 10° to 70° or more preferably of 20° to 60°.

Next, a test was conducted on the coating nozzle 20 shown in FIG. 7 to examine the ratio (d/D) of the diameter d of the nozzle end orifice 21 to the outside diameter D of the coating nozzle 20.

Figure 10:
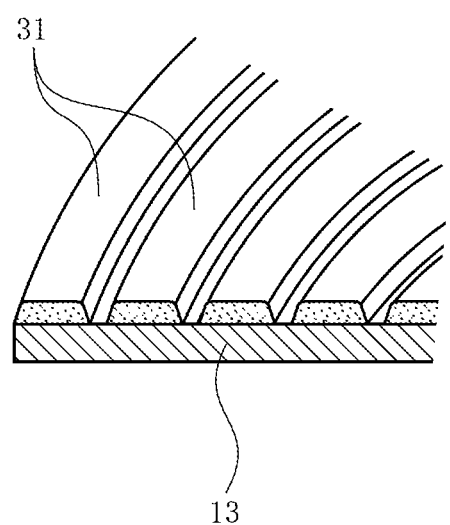
FIG. 10 is a fragmentary view illustrating how the coating solution applied to the coating object suffers from coating discontinuities or streaking in a case where a ratio (d/D) of a diameter d of the nozzle orifice to an outside diameter D of the coating nozzle is too small.
Figure 11:
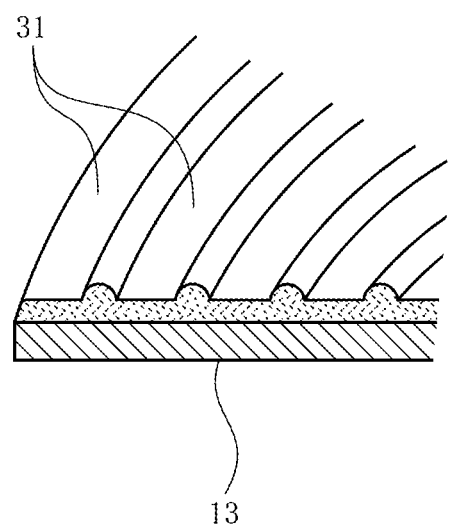
FIG. 11 is a fragmentary view illustrating how ridge is formed on the coating object at a contact area where a subsequently applied coat of coating solution abuts on a previously applied coat of coating solution in a case where the ratio (d/D) of the diameter d of the nozzle orifice to the outside diameter D of the coating nozzle is too large.

The results indicate that if the value of the above ratio (d/D) is too small, the nozzle end orifice 21 of the coating nozzle 20 discharges such a small amount of coating solution 31 that the coating object 13 suffers from discontinuities or streaks of the applied coating solution 31, as shown in FIG. 10. Therefore, there are areas uncoated or poorly coated with the coating solution 31. On the other hand, if the value of the above ratio (d/D) is too large, ridge is formed on the coating object at a contact area where a subsequently applied coat of solution abuts on a previously applied coat of solution, as shown in FIG. 11.

The following test was conducted using a coating nozzle 20 formed with a notch 22 having an inclination angle α of 45° to the horizontal plane. In the test, the diameter d of the nozzle end orifice 21 of this coating nozzle 20 and the viscosity of the above coating solution 31 were varied. The nozzles having the different orifice diameters applied the coating solutions 31 of the different viscosities to the coating objects 13, respectively. The resultant coats were examined for any discontinuities of the applied coating solution 31 and any ridges on the above-described contact area.

Figure 12:
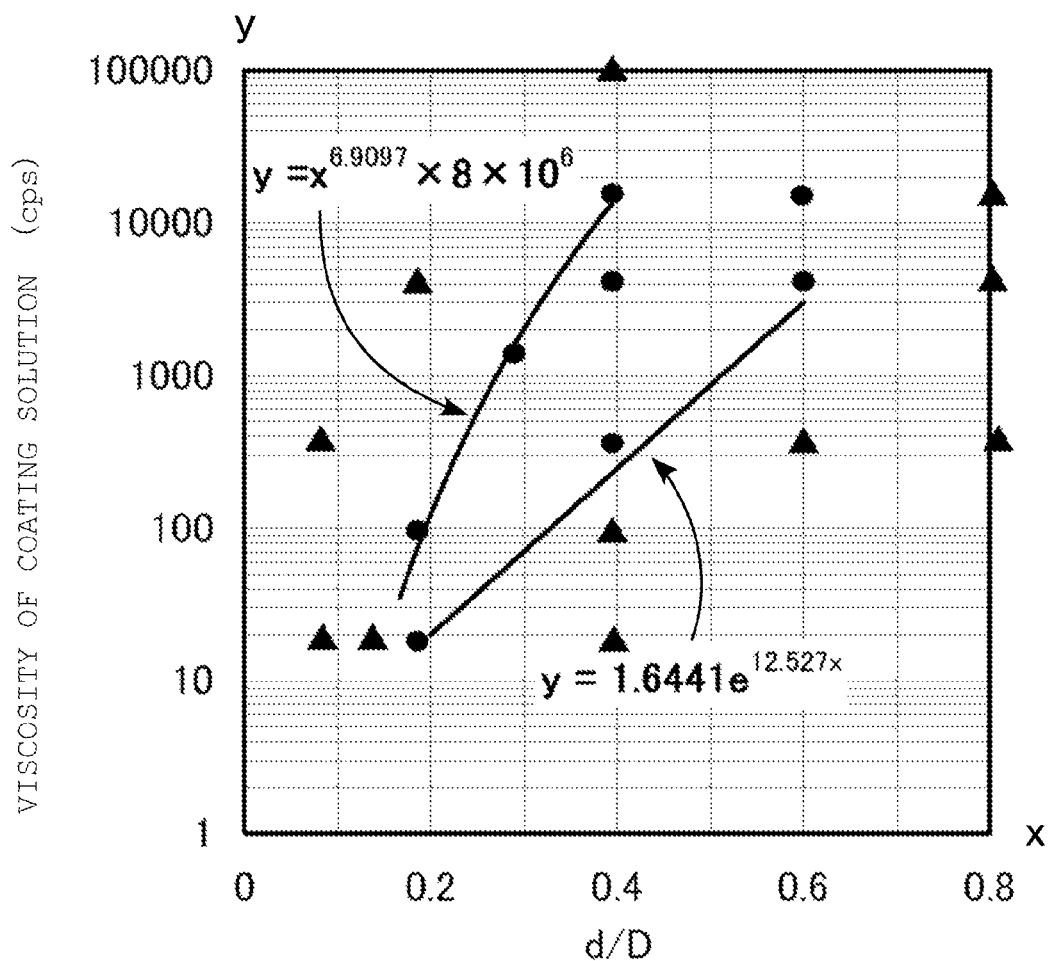
FIG. 12 is a graph showing the results of a test wherein the coating solutions varied in viscosity were applied to the coating objects by using the coating nozzles having different ratios (d/D) of the diameter d of the nozzle orifice to the outside diameter D of the coating nozzle.

The results are shown in a coordinate graph of FIG. 12 wherein the value of d/D is plotted on the x axis and the viscosity of the coating solution on the y axis. In the graph, ▲ represents a point exhibiting the discontinuity of coating solution or the ridge on the above-described contact area, and ● represents a point free from these defects.

The results indicate that in the case of a coating nozzle 20 having an outside diameter D of 5 mm and including a notch 22 having an inclination angle α of 45° to the horizontal plane, it is preferred to satisfy the condition 0.16<d/D<0.8 or particularly preferred to satisfy the condition 0.25≤d/D≤0.6 provided that the coating solution 31 has a viscosity in the range of that of a commonly used coating solution. From the standpoint of a relation between the value of d/D and the viscosity of the coating solution 31, it is preferred to satisfy the condition $x^{6.9097} \times 8 \times 10^6 \leq y \leq 1.6441 e^{12.527x}$.

Figure 13:
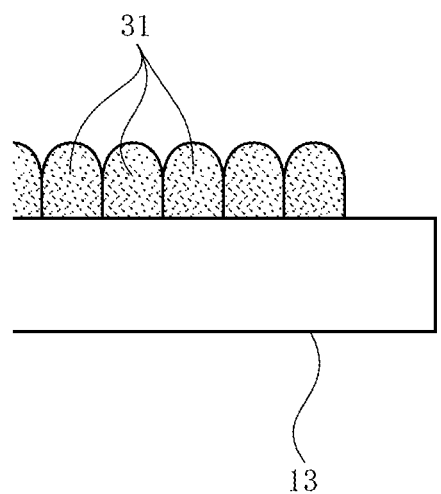
FIG. 13 is a group of fragmentary views of the coating applicator of the above embodiment, each illustrating an exemplary condition of the coating solution fed to the surface of the coating object from the nozzle end orifice of the coating nozzle.
Figure 13:
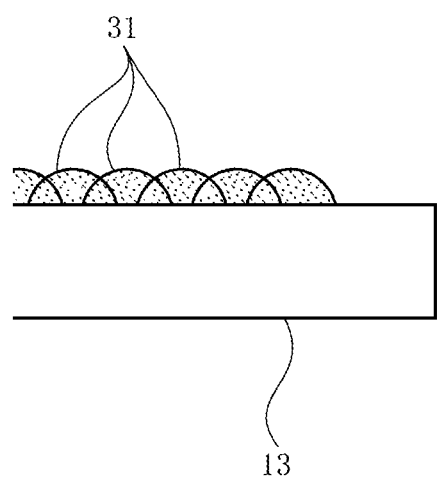

When the coating solution 31 is applied to the surface of the coating object 13 by moving the coating nozzle 20 radially outwardly from the center of rotation of the coating object 13 being rotated, the rotational velocity of the coating object 13 and the radial feed rate of the coating nozzle 20 can be controlled properly in view of the properties, such as viscosity, of the coating solution 31. As shown in FIG. 13A, for example, the nozzle end orifice 21 of the coating nozzle 20 may successively feed the drops of coating solution 31 to the coating object 13 in a manner that the drops of coating solution are closely arranged on the coating object. Alternatively, as shown in FIG. 13B, the nozzle end orifice 21 of the coating nozzle 20 may feed the drops of coating solution 31 in a manner that the drops of coating solution are partially overlapped with one another. Particularly in the case of applying the drops of coating solution 31 in the partially overlapping relation, the notch 22 of the coating nozzle 20 corresponds to place where the subsequently applied drop of solution joins the previously applied drop of solution. Therefore, the accumulation of coating solution 31 on the coating nozzle 20 can be suppressed even if the amount of coating solution 31 applied by the coating nozzle is increased. Further, the thickness variations of the coat can be reduced by increasing the overlap between the consecutive drops of coating solution 31.

Figure 14:
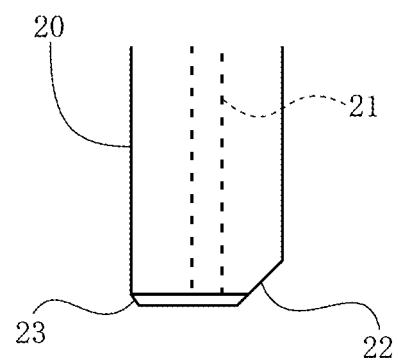
FIG. 14 is a fragmentary view illustrating an exemplary modification of the coating nozzle employed by the coating applicator of the above embodiment.

The embodiment employs the coating nozzle 20 that includes the angled notch 22 formed at a part of the end thereof. However, as shown in FIG. 14, a coating nozzle 20 further including a chamfer 23 smaller than the notch 22 and formed along an outside circumference of the end formed with the notch 22 is also usable.

It is preferred to use the coating nozzle 20 having the chamfer 23 smaller than the notch 22 and extended along the outside circumference of the end formed with the notch 22. This chamfer 23 is effective to return some coating solution 31 shifted to the upstream notch 22 of the coating nozzle 20 or upstream from the position to feed the coating solution 31 to the coating object 13 to the correct position to feed the coating solution 31 to the coating object 13. Thus, the coating nozzle can prevent the accumulation of coating solution 31 on the notch 22, achieving the even application of coating solution 31 to the surface of the coating object 13.

When applying the coating solution 31 to the surface of the coating object 13 according to the embodiment, the coating nozzle 20 is moved relative to the coating object 13 radially outwardly from the center of rotation of the coating object 13 to the outside circumference thereof. However, the coating nozzle 20 may also be moved radially inwardly from the outside circumference of the coating object 13 being rotated to the center of rotation thereof.

In the case where the coating nozzle 20 is moved radially inwardly from the outside circumference of the coating object 13 being rotated to the center of rotation thereof, as well, the coating nozzle 20 may apply the coating solution 31 to the surface of the coating object 13 by discharging the coating solution 31 from the nozzle end orifice 21 while positioning the notch 22 at the end of the coating nozzle 20 upstream from the position to feed the coating solution 31 to the coating object 13 being rotated. Similarly to the above-described coating application, the coating nozzle 20 is prevented from being affected by the surface tension and the like which cause some coating solution 31 to accumulate into bump on the upstream portion of the coating nozzle. Thus, the coating nozzle is adapted for the even application of the coating solution 31 to the surface of the coating object 13, achieving the uniformity in coat thickness and width.

Before starting the application of the coating solution 31, the nozzle orifice 21 of the coating nozzle 20 may preferably be shifted from the center of rotation of the coating object 13 in the opposite direction to the movement of the coating nozzle 20. If the coating application is started with the nozzle orifice so shifted, a delay before the discharge of the coating solution 31 from the nozzle orifice 21 can be compensated.

In a case where the velocity of the coating nozzle 20 moved in the radial direction is more or less constant, the coating solution 31 is applied to the surface of the coating object 13 apparently in a spiral form.

The above coating object 13 according to the embodiment may include ceramic substrates, silicon substrates, glass substrates, plastic substrates, metal plates and the like.

The coating object 13 coated with the coating solution 31 in the above-described manner may be effectively used in electronic devices, medical devices such as biochips, and the like.

Although the present invention has been fully described by way of examples, it is to be noted that various changes and modifications will be apparent to those skilled in the art.

Therefore, unless otherwise such changes and modifications depart from the scope of the present invention, they should be construed as being included therein.

The invention claimed is:

1. A coating applicator comprising:
    a turntable retaining a coating object thereon;
    a rotating device for rotating the turntable;
    a coating nozzle for applying a coating solution to a surface of the coating object by discharging the coating solution from a nozzle orifice at a flattened end thereof to the coating object retained on the turntable;
    a transfer device for moving the coating nozzle relative to the coating object in a direction intersecting a rotational direction of the coating object; and
    a rotation control unit for controlling the rotation of the coating nozzle,
    wherein the coating nozzle including the nozzle orifice is formed with an angled notch at only one side of the coating nozzle, forming a flat plane intersecting with the flattened end of the coating nozzle and the rotation control unit controls the rotation of the coating nozzle in a manner to position the angled notch of the coating nozzle upstream from a position to feed the coating solution to the coating object being rotated, and
    wherein the coating nozzle is formed with a chamfer that is smaller in width than the angled notch and extends along an outside circumference of the coating nozzle end formed with the angled notch.

2. The coating applicator according to claim 1, wherein the rotation control unit controls the rotation of the coating nozzle in a manner that the coating nozzle is rotated to a position such that the angled notch thereof is kept in the same direction as that of a resultant vector which is formed from a feed rate vector of the coating nozzle moved relative to the coating object in the direction intersecting the rotational direction of the coating object and a velocity vector of the coating nozzle moved relative to the coating object in a normal direction from the position for the coating nozzle to feed the coating solution.

3. The coating applicator according to claim 1, wherein the angled notch has an inclination angle $\alpha$ relative to the flattened end of the coating nozzle in the range of 10° to 70°.

4. The coating applicator according to claim 1, wherein the angled notch has an inclination angle $\alpha$ relative to the flattened end of the coating nozzle in the range of 20° to 60°.

5. The coating applicator according to claim 1, wherein the coating nozzle discharges the coating solution as moved radially outwardly from the center of rotation of the coating object being rotated.

6. The coating applicator according to claim 1, wherein the coating nozzle applies the coating solution to the coating object in a manner that an applied drop of coating solution overlaps with at least a part of the previously applied drop of coating solution.

7. An electronic device manufactured by applying the coating solution to the coating object by the coating applicator of claim 1.

* * * * *